(12) United States Patent
Bader et al.

(10) Patent No.: US 10,461,609 B2
(45) Date of Patent: Oct. 29, 2019

(54) MULTI-GATE HALF-BRIDGE CIRCUIT AND PACKAGE

(71) Applicant: Infineon Technologies AG, Neubiberg (DE)

(72) Inventors: Markus Bader, Merching (DE); Stefan Mieslinger, Kottgeisering (DE)

(73) Assignee: Infineon Technologies AG, Neubiberg (DE)

( * ) Notice: Subject to any disclaimer, the term of this patent is extended or adjusted under 35 U.S.C. 154(b) by 389 days.

(21) Appl. No.: 15/285,317

(22) Filed: Oct. 4, 2016

(65) Prior Publication Data
US 2018/0097425 A1   Apr. 5, 2018

(51) Int. Cl.
| | |
|---|---|
| H02K 11/33 | (2016.01) |
| H02M 7/217 | (2006.01) |
| H02K 11/38 | (2016.01) |
| H03K 17/687 | (2006.01) |
| H02M 7/5387 | (2007.01) |
| H03K 17/10 | (2006.01) |
| H02K 11/20 | (2016.01) |
| H02M 7/21 | (2006.01) |

(Continued)

(52) U.S. Cl.
CPC .......... *H02K 11/33* (2016.01); *H02K 11/38* (2016.01); *H02M 7/217* (2013.01); *H02M 7/5387* (2013.01); *H03K 17/102* (2013.01); *H03K 17/687* (2013.01); *H01L 51/057* (2013.01); *H01L 2224/40245* (2013.01); *H01L 2224/48247* (2013.01); *H02M 7/003* (2013.01); *H02P 7/04* (2016.02); *H03K 2217/0063* (2013.01); *H03K 2217/0072* (2013.01)

(58) Field of Classification Search
CPC ....... H02K 11/33; H02K 11/38; H02M 7/217; H02M 7/21; H02M 7/162; H02M 7/1623; H02M 7/003; H02P 7/04; H02P 7/03; H01L 2224/48247
See application file for complete search history.

(56) References Cited

U.S. PATENT DOCUMENTS

| | | | | |
|---|---|---|---|---|
| 5,495,155 A | * | 2/1996 | Juzswik | G01R 31/42 318/256 |
| 6,891,739 B2 | * | 5/2005 | Nadd | H02M 7/003 363/147 |

(Continued)

FOREIGN PATENT DOCUMENTS

| | | |
|---|---|---|
| CN | 101568951 A | 10/2009 |
| CN | 102835003 A | 12/2012 |
| CN | 103036547 A | 4/2013 |

OTHER PUBLICATIONS

"BTM7740G, TrilithIC," Data Sheet, Rev. 1.0, Automotive Power, Infineon, May 2007, 18 pp.

(Continued)

*Primary Examiner* — Edgardo San Martin
(74) *Attorney, Agent, or Firm* — Shumaker & Sieffert, P.A.

(57) ABSTRACT

In some examples, a half-bridge circuit includes a first switch including a first load terminal, a second load terminal, a first control terminal, and a second control terminal that is electrically isolated from the first control terminal of the first switch. The half-bridge circuit further includes a second switch including a first load terminal electrically connected to the second load terminal of the first switch, a second load terminal, and a control terminal.

20 Claims, 7 Drawing Sheets

(51) Int. Cl.
H02M 7/00 (2006.01)
H01L 51/05 (2006.01)
H02P 7/03 (2016.01)

(56) References Cited

U.S. PATENT DOCUMENTS

| | | | |
|---|---|---|---|
| 7,426,124 B2* | 9/2008 | Kong | H02M 7/538466 |
| | | | 363/132 |
| 9,041,460 B2* | 5/2015 | Voss | H01L 25/072 |
| | | | 257/203 |
| 9,203,244 B2 | 12/2015 | Abe | |
| 9,660,537 B1* | 5/2017 | Vinciarelli | H02M 3/33507 |
| 9,819,338 B2* | 11/2017 | Otake | H01L 29/7802 |
| 10,014,798 B1* | 7/2018 | Vinciarelli | H02M 3/33507 |
| 10,020,727 B2* | 7/2018 | Pasqualetto | H02P 7/29 |
| 2010/0321363 A1 | 12/2010 | Morita et al. | |
| 2013/0082741 A1 | 4/2013 | Domes | |
| 2017/0271999 A1* | 9/2017 | Yoshinaga | H01L 25/072 |
| 2018/0048306 A1* | 2/2018 | Otake | H01L 29/7802 |

OTHER PUBLICATIONS

"BTN8982TA, High Current PN Half Bridge, NovalithIC," Data Sheet, Rev. 1.0, Automotive Power, Infineon, May 17, 2013, 26 pp.
"TLE 5206-2, 5-A H-Bridge for DC-Motor Applications," Data Sheet, Rev. 1.1, Infineon, Jul. 31, 2007, 24 pp.
Office Action, in the Chinese language, from counterpart Chinese Application No. 201710939283.X, dated Jun. 28, 2019, 10 pp.

* cited by examiner

MULTI-GATE HALF-BRIDGE CIRCUIT AND PACKAGE

TECHNICAL FIELD

This disclosure relates to half bridge circuits in power electronics.

BACKGROUND

A half-bridge circuit may include two analog devices or switches. A half-bridge circuit may be used in power supplies for motors, in rectifiers, and for power conversion. Each half-bridge circuit package has several contacts and may include several conductive paths to connect the contacts to each other and to external components. Each switch in a half-bridge circuit may include a control terminal such as a gate. If a control terminal is activated, even accidentally, the respective switch may conduct electricity to an output node.

SUMMARY

This disclosure describes techniques for a half-bridge circuit including a high-side switch and a low-side switch. One or both of the two switches may include multiple control terminals. In some examples, a multi-gate switch with multiple control terminals may provide redundancy by conducting electricity only if appropriate voltages are applied to all of the gates of the multi-gate switch.

In some examples, a half-bridge circuit includes a first switch including a first load terminal, a second load terminal, a first control terminal, and a second control terminal that is electrically isolated from the first control terminal of the first switch. The half-bridge circuit further includes a second switch including a first load terminal electrically connected to the second load terminal of the first switch, a second load terminal, and a control terminal.

In some examples, a half-bridge circuit package includes a die paddle and a first semiconductor switch electrically connected to the die paddle. The half-bridge circuit package further includes a second semiconductor switch electrically connected to the die paddle and at least five pins including a first pin electrically connected to a load terminal of the first semiconductor switch. The at least five pins further include a second pin electrically connected to a first control terminal of the first semiconductor switch. The at least five pins further include a third pin electrically connected to a second control terminal of the first semiconductor switch, wherein the second control terminal of the first semiconductor switch is electrically isolated from the first control terminal of the first semiconductor switch. The at least five pins further include a fourth pin electrically connected to a control terminal of the second semiconductor switch. The at least five pins further include a fifth pin electrically connected to a load terminal of the second semiconductor switch.

In some examples, a method for constructing a half-bridge circuit package includes electrically connecting a first side of a first semiconductor switch to a die paddle and electrically connecting a first side of a second semiconductor switch to the die paddle. The method may further include electrically connecting a first conductive element to a first pin and a load terminal on a second side of the first semiconductor switch. The method may also include electrically connecting a second conductive element to a second pin and a first control terminal on the second side of the first semiconductor switch. The method may also include electrically connecting a third conductive element to a third pin and a second control terminal on the second side of the first semiconductor switch. The method may further include electrically connecting a fourth conductive element to a fourth pin and a control terminal on a second side of the second semiconductor switch. In addition, the method may also include electrically connecting a fifth conductive element to a fifth pin and a load terminal on the second side of the second semiconductor switch.

The details of one or more examples are set forth in the accompanying drawings and the description below. Other features, objects, and advantages will be apparent from the description and drawings, and from the claims.

DETAILED DESCRIPTION

A half-bridge circuit may drive an electrical load in an application where safety is desirable, such as an electric motor in an automobile. To ensure that a switch in the half-bridge circuit conducts electricity only when desired, the switch may include multiple control terminals. To cause the switch with multiple control terminals to conduct electricity between load terminals, an external circuit may apply an appropriate voltage to each control terminal of the switch. The multiple control terminals may prevent unintended activation of the electrical load and increase safety.

Figure 1:
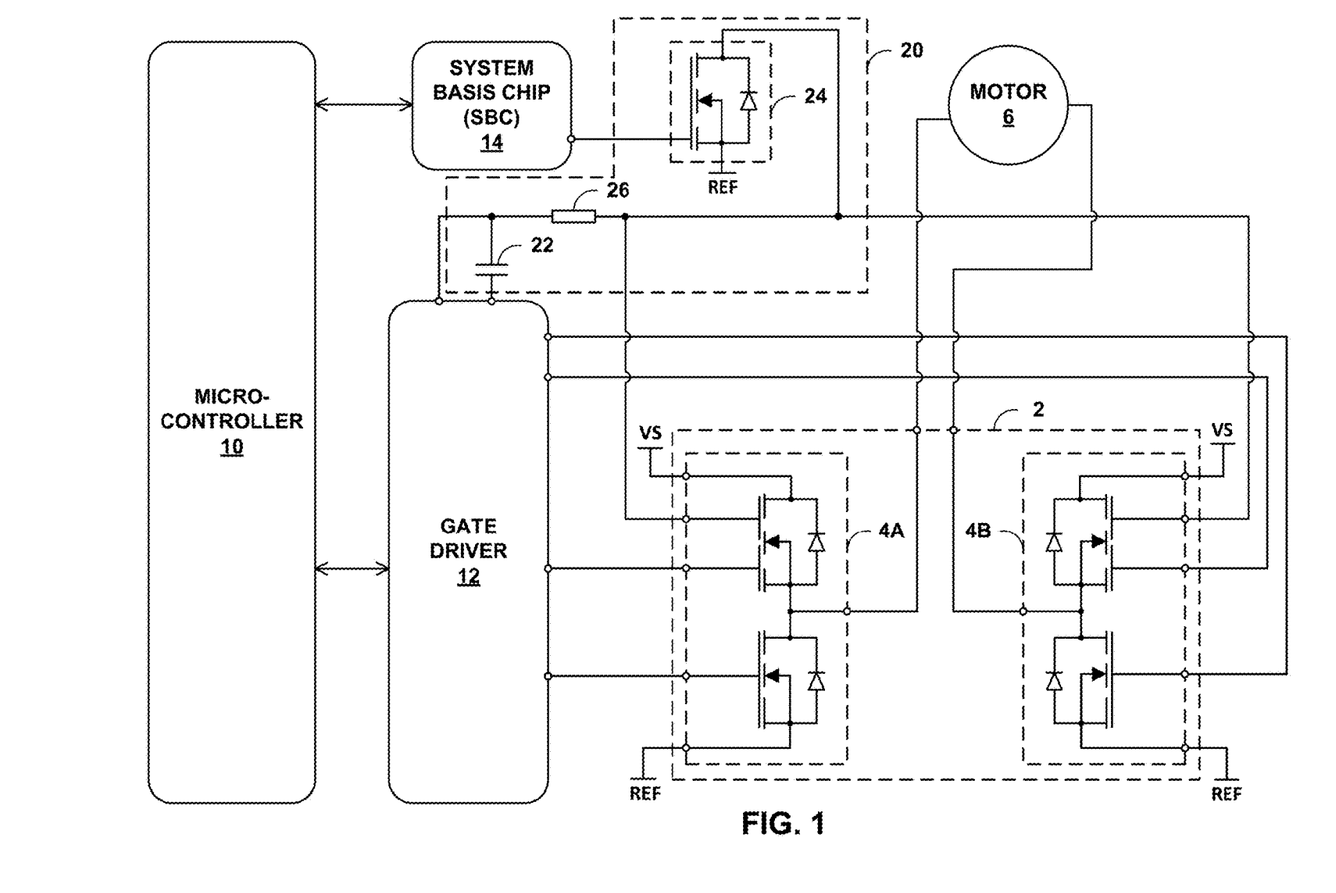
FIG. 1 is a conceptual block diagram of an H-bridge circuit configured to drive an electric motor, in accordance with some examples of this disclosure.

FIG. 1 is a conceptual block diagram of an H-bridge circuit 2 configured to drive an electric motor 6, in accordance with some examples of this disclosure. In some examples, H-bridge circuit 2 may include two half-bridge circuits 4A, 4B and be configured to drive motor 6. Microcontroller 10, gate driver 12, and system basis chip 14 may be configured to control the operation of H-bridge circuit 2 and the operation of motor 6. In some examples, H-bridge circuit 2 may drive an electrical load as an alternative to or in addition to motor 6.

Each of half-bridge circuits 4A, 4B may include a high-side switch and a low-side switch in a half-bridge arrangement. The output node, also known as the switch node, of each of half-bridge circuits 4A, 4B may be electrically connected to motor 6 and a load terminal of each switch. Another load terminal of the high-side switch may be electrically connected to a supply voltage labeled "VS," which may be called an input voltage, a supply voltage, or a power supply. Another load terminal of the low-side switch may be electrically connected to a reference voltage labeled "REF," such as a reference ground.

Although the switches of half-bridge circuits 4A, 4B are depicted as MOSFET symbols in FIG. 1, it is contemplated that any electrical device that is controlled by a voltage may be used in place of the MOSFETs as shown. For example, the switches may include, but are not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

The switches of half-bridge circuits 4A, 4B may include n-type transistors or p-type transistors, and switches may include vertical power transistors. For a vertical power transistor, the source (or emitter) terminal and the drain (or collector) terminal may be on opposite sides or opposite surfaces of the transistor or semiconductor switch. Current in a vertical power transistor may flow through the transistor from top to bottom or from bottom to top. In some examples, half-bridge circuits 4A, 4B may include lateral transistors or horizontal transistors that may offer certain benefits such as ease of fabrication and cost. In some examples, the switches of half-bridge circuits 4A, 4B may include other analog devices such as diodes. The switches of half-bridge circuits 4A, 4B may also include freewheeling diodes connected in parallel with the switches to prevent reverse breakdown of the switches. In some examples, the switches of half-bridge circuits 4A, 4B may operate as switches or as analog devices.

The switches of half-bridge circuits 4A, 4B may include three terminals: two load terminals and at least one control terminal. For MOSFET switches, the switches may include a drain terminal, a source terminal, and at least one gate terminal. For purposes of this disclosure, the terms "gate" and "gate terminal" may include all forms of control terminals, such as base terminals in bipolar transistors. Therefore, for purposes of this disclosure, "gate" and "control terminal" may be synonymous. Current may flow between the drain and source of the switches, based on the voltage at the gate. Based on the voltage at the gate(s) of the high-side switch, electrical current may flow from the supply voltage VS to the output node of one of half-bridge circuits 4A, 4B. Similarly, based on the voltage at the gate of the low-side switch, electrical current may flow from the output node to the reference node REF.

The switches of half-bridge circuits 4A, 4B may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, SiC switches may experience lower switching power losses. Improvements in magnetics and faster switching, such as Gallium Nitride (GaN) switches, may support higher frequency converters. These higher frequency circuits may require control signals to be sent with more precise timing, as compared to lower-frequency circuits.

In some examples, a circuit package of this disclosure may include one of half-bridge circuits 4A, 4B. In some examples, a circuit package may include two of half-bridge circuits 4A, 4B so that both half-bridge circuits of H-bridge circuit 2 are contained in a single package. In some examples, a circuit package of this disclosure may include multiple half-bridge circuits for driving a multiphase motor and/or a brushless direct-current motor. For a multiphase electric motor, the driving circuit may include one or more half-bridge circuits for each phase.

Motor 6 may comprise an electric motor that is driven by half-bridge circuits 4A, 4B. Motor 6 may convert electrical current to mechanical power and may include one or more phases. Motor 6 may be used in a variety of applications including automotive, heating, appliances, power tools, and the like. For automobiles, motor 6 may be used to control an electric parking brake, a seat control, a steering wheel lock, or a belt tensioner. In automotive applications, motor 6 may remain idle when the parking brake, as an example, is not being used. When a user pulls the parking brake lever or presses a button, half-bridge circuits 4A, 4B may conduct electricity to drive motor 6 to prevent the automobile from rolling. Therefore, it may be desirable for the switches of half-bridge circuits 4A, 4B to drive motor 6 only when operation of the parking brake, for example, is appropriate.

Microcontroller 10 may include processing circuitry for generating signals and/or voltages to the control terminals of the switches of half-bridge circuits 4A, 4B. Microcontroller 10 may generate and output pulse-width modulation (PWM) signals to half-bridge circuits 4A, 4B through gate driver 12. FIG. 1 depicts microcontroller 10, gate driver 12, and system basis chip (SBC) 14 as three separate components, but microcontroller 10, gate driver 12, and SBC 14 may include a single integrated component, or an integrated component may include two of microcontroller 10, gate driver 12, and SBC 14. In some examples, microcontroller 10, gate driver 12, SBC 14, or one or two of these components may be located within a circuit package that includes one or both of half-bridge circuits 4A, 4B.

Gate driver 12 may receive electrical signals from microcontroller 10 and output electrical signals to the switches of half-bridge circuits 4A, 4B. Gate driver 12 may include a power amplifier for receiving a low-power input from microcontroller 10 and producing a higher-power electrical signal to apply to a control terminal and/or gate of the switches of half-bridge circuits 4A, 4B. By amplifying the power of the voltage signals from microcontroller 10, gate driver 12 may cause the switches of half-bridge circuits 4A, 4B to switch from conducting electricity to not conducting electricity at faster speeds.

In some examples, microcontroller 10 and gate driver 12 may cause H-bridge circuit 2 to drive motor 6 by conducting electricity through a high-side switch of half-bridge circuit 4A and a low-side switch of half-bridge circuit 4B. Microcontroller 10 may cause H-bridge circuit 2 to reverse, actively brake, or actively freewheel the operation of motor 6 by conducting electricity through a high-side switch of half-bridge circuit 4B and a low-side switch of half-bridge circuit 4A. Microcontroller 10 may cause H-bridge circuit 2 to stop motor 6 by conducting electricity through a high-side switch of half-bridge circuit 4A and a high-side switch of half-bridge circuit 4B, or through a low-side switch of half-bridge circuit 4A and a low-side switch of half-bridge circuit 4B. Microcontroller 10 may also cause H-bridge circuit 2 to passively freewheel motor 6 by turning off both switches of one of half-bridge circuit 4A or half-bridge circuit 4B.

SBC 14 may include several functions of an electronic control unit for the larger system of which H-bridge circuit 2 is located. These functions may include watchdog functions, control of power supply, and control of fail-safe circuit 20. SBC 14 may activate fail-safe circuit 20 by applying a voltage to the gate of fail-safe switch 24 to cause fail-safe switch 24 to conduct electricity. The fail-safe circuit 20 may also include charge pump 26 and capacitor 22, each of which may be electrically connected to gate driver 12. To cause H-bridge circuit 2 to drive motor 6, SBC 14 may open fail-safe switch 24, and gate driver 12 may apply an appropriate voltage to the control terminals of H-bridge circuit 2 through charge pump 26.

In accordance with the techniques of this disclosure, a switch of each of half-bridge circuits 4A, 4B may include two control terminals. When SBC 14 closes fail-safe switch 24, fail-safe switch 24 may conduct electricity from a control terminal of each high-side switch of half-bridge circuits 4A, 4B, causing the high-side switches to cease conducting electricity. In some examples, fail-safe switch 24 may be electrically connected to a control terminal of one or both low-side switches of half-bridge circuits 4A, 4B. SBC 14 may close fail-safe switch 24 to prevent H-bridge circuit 2 from driving motor 6 at times when motor 6 should not operate. Each of half-bridge circuits 4A, 4B may include a control terminal that is electrically connected to fail-safe switch 24, thereby providing a redundant switch-off path for H-bridge circuit 2 and motor 6. This redundancy may prevent the unwanted activation of motor 6 for certain applications.

For safety-critical applications, a redundant layer of safety may be desirable. H-bridge circuit 2 may include a redundant switch-off path within a single package, as compared to another H-bridge circuit that includes two high-side switches connected in series, where a control terminal of one of the high-side switches is electrically connected to fail-safe switch 24. Half-bridge circuits 4A, 4B may conserve space and experience lower power dissipation, as compared to a half-bridge circuit with two high-side switches connected in series. Combining one or both of half-bridge circuits 4A, 4B into a single package, as compared to using discrete switch packages, may save space and reduce costs in some applications. A single package for one or both of half-bridge circuits 4A, 4B may include fewer and shorter electrical connections between components, thereby reducing the effect of parasitics in the half-bridge circuit.

Figure 2A:
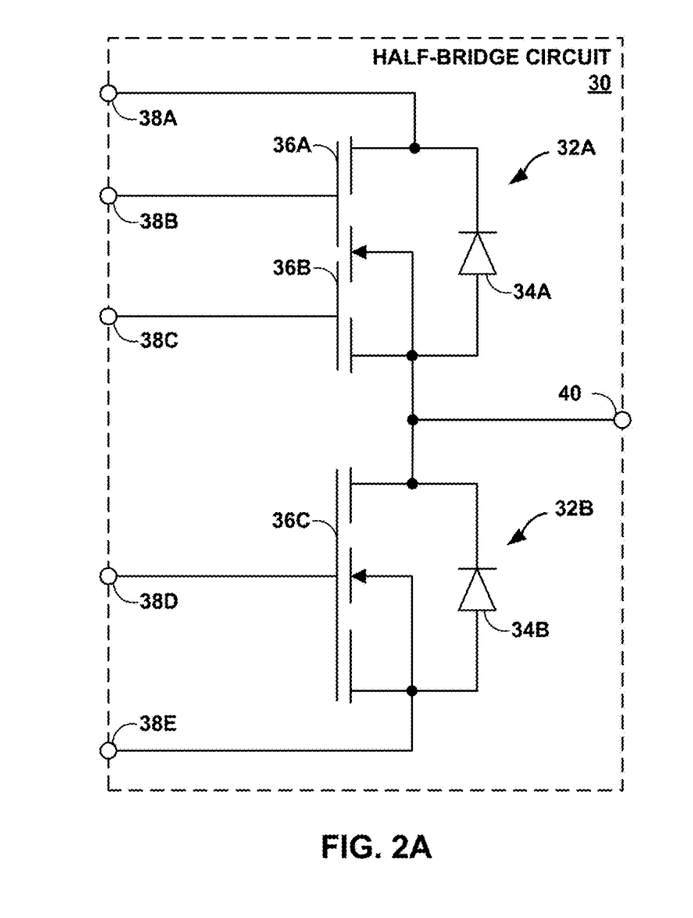
FIGS. 2A-2B are circuit diagrams of half-bridge circuits, in accordance with some examples of this disclosure.
Figure 2B:
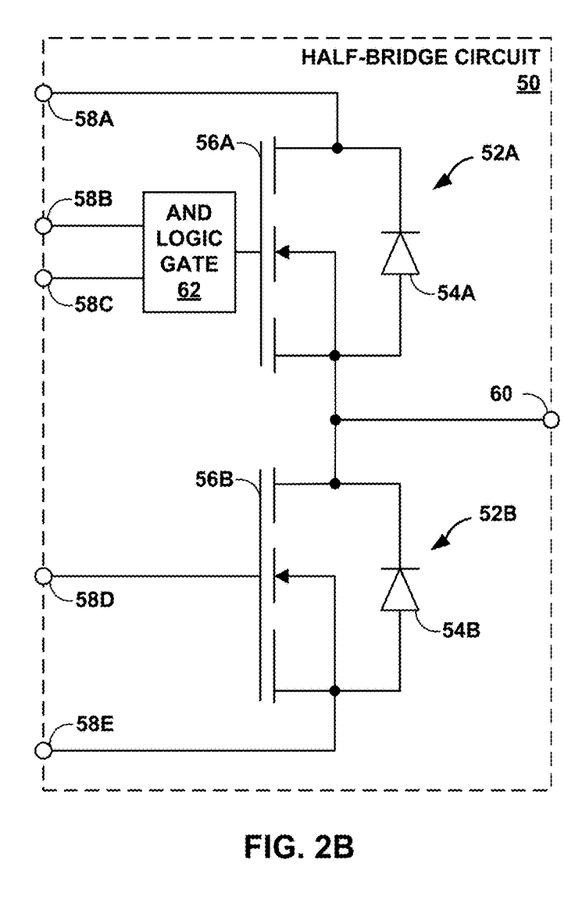

FIGS. 2A-2B are circuit diagrams of half-bridge circuits 30, 50, in accordance with some examples of this disclosure. Half-bridge circuit 30 may include a high-side switch 32A and a low-side switch 32B. Each switch of half-bridge circuit 30 may include one of freewheeling diodes 34A, 34B to prevent reverse breakdown of switches 32A, 32B. A load terminal of each of switches 32A, 32B may be electrically connected to output node 40. In some examples, output node 40 may be configured to drive an electric motor.

In some examples, high-side switch 32A may include two control terminals 36A, 36B. Each of control terminals 36A, 36B may be electrically connected to one of control nodes 38B, 38C, and control terminal 36B may be electrically isolated from control terminal 36C. In some examples, electrical isolation may mean zero electrical current or a very high-ohm connection between two or more components. In some examples, even though two components are designed to be electrically isolated, there may be leakage current, electron tunneling, or other means for electrical current to flow at very low rates. In addition, two electrically isolated components may include capacitance between the two components, and one component may produce an electric field that affects an electrically isolated component.

High-side switch 32A may conduct electricity between input node 38A and output node 40 only when an appropriate voltage is applied to both of control terminals 36A, 36B. If high-side switch 32A includes an n-channel MOSFET, an appropriate voltage at control terminal 36B may be higher than the sum of the voltage at output node 40 and a threshold voltage of the n-channel MOSFET. Thus, high-side switch 32A may include a redundant control terminal to allow a fail-safe circuit to shut off the conduction of electricity through high-side switch 32A by reducing the voltage at one of control node 38A, 38B.

In some examples, each of switches 32A, 32B may include an n-channel MOSFET. Input node 38A may be electrically connected to a drain terminal of high-side switch 32A. Reference node 38E may be electrically connected to a source terminal of low-side switch 32B. A source terminal of high-side switch 32A and a drain terminal of low-side switch 32B may be electrically connected to output node 40. Control node 38C may be electrically connected to control terminal 36B and a gate driver, and control node 38B of high-side switch 32A may be electrically connected to a fail-safe circuit. Control node 38D may be electrically connected to control terminal 36C and a gate driver.

Half-bridge circuit 50 may include an alternative configuration, as compared to half-bridge circuit 30. High-side switch 52A may include control terminal 56A that is electrically connected to an output of AND logic gate 62. Control nodes 58B, 58C may be electrically connected to inputs of AND logic gate 62. AND logic gate 62 may output a low voltage if the voltage at either of control nodes 58B, 58C is low. Thus, AND logic gate 62 may provide a redundant switch-off path by delivering an appropriate voltage to control terminal 56A only if there is an appropriate voltage at both of control nodes 58B, 58C. Control terminal 56A may be called "combined control terminal 56."

Figure 3A:
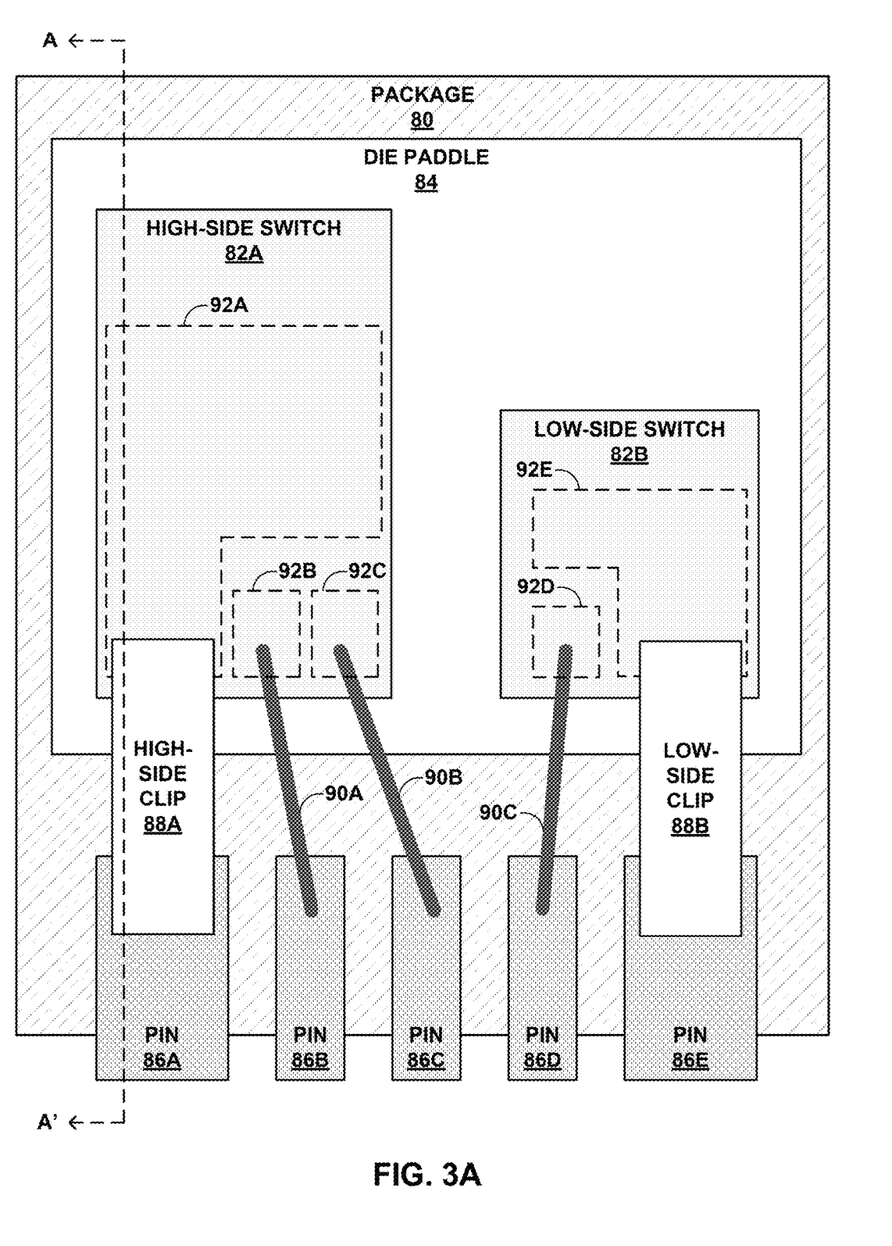
FIG. 3A is a top-view diagram of a half-bridge package, in accordance with some examples of this disclosure.

FIG. 3A is a top-view diagram of a half-bridge package 80, in accordance with some examples of this disclosure. Package 80 may include high-side switch 82A and low-side switch 82B operating as a half-bridge circuit. Each of switches 82A, 82B may include a discrete semiconductor die with two load terminals and at least one control terminal on the surfaces of the semiconductor die. A load terminal of each of switches 82A, 82B may be electrically connected to die paddle 84, which may operate similar to output nodes 40, 60 in FIGS. 2A-2B. Die paddle 84 may include a leadframe, a metal layer, a metallization layer, copper, an alloy including copper, and/or any other suitable conductive material. If switches 82A, 82B include MOSFETs, die paddle 84 may be electrically connected to a source terminal of high-side switch 82A and a drain terminal of high-side switch 82B.

The electrically connections between components in package 80 may formed by soldering. Soldering components to form electrical connections may include placing solder between the components, applying heat to melt the solder, and allowing the solder to cool to form the electrical connection. The components of package 80 may also be glued or adhered together with conductive paste, conductive tape, conductive epoxy, and/or metal sintering. The connections between switches 82A, 82B, die paddle 84, clips 88A, 88B, may include metalized plated laser vias, solder, and/or high-pressure/high-frequency metalized bonding such as diffusion bonding. Diffusion bonding may include direct bonding between switches 82A, 82B, each of which may be a semiconductor die, and die paddle 84.

High-side switch 82A may include another load terminal 92A on an opposite side from die paddle 84 that may be electrically connected to pin 86A through high-side clip 88A. Low-side switch 82B may include another load terminal 92E on an opposite side from die paddle 84 that may be electrically connected to pin 86E through high-side clip 88B. Clips 88A, 88B may include conductive elements such as metal layers, metal clips, aluminum ribbons, wire bonds, and/or any other suitable conductive material.

A first control terminal of high-side switch 82A may be electrically connected to pin 86B through conductive element 90A. A second control terminal of high-side switch 82A may be electrically connected to pin 86C through conductive element 90B. A control terminal of low-side switch 82B may be electrically connected to pin 86D through conductive element 90C. Conductive elements 90A-90C may include metal layers, metal clips, aluminum ribbons, wire bonds (e.g., copper, gold, etc.), and/or any other suitable conductive material.

In some examples, package 80 may include a second half-bridge circuit such that package 80 includes an H-bridge circuit with four switches. In some examples, package 80 may include a gate driver circuit and/or an AND logic gate, where an output of the AND logic gate is electrically connected to a control terminal of one of switches 82A, 82B.

Figure 3B:
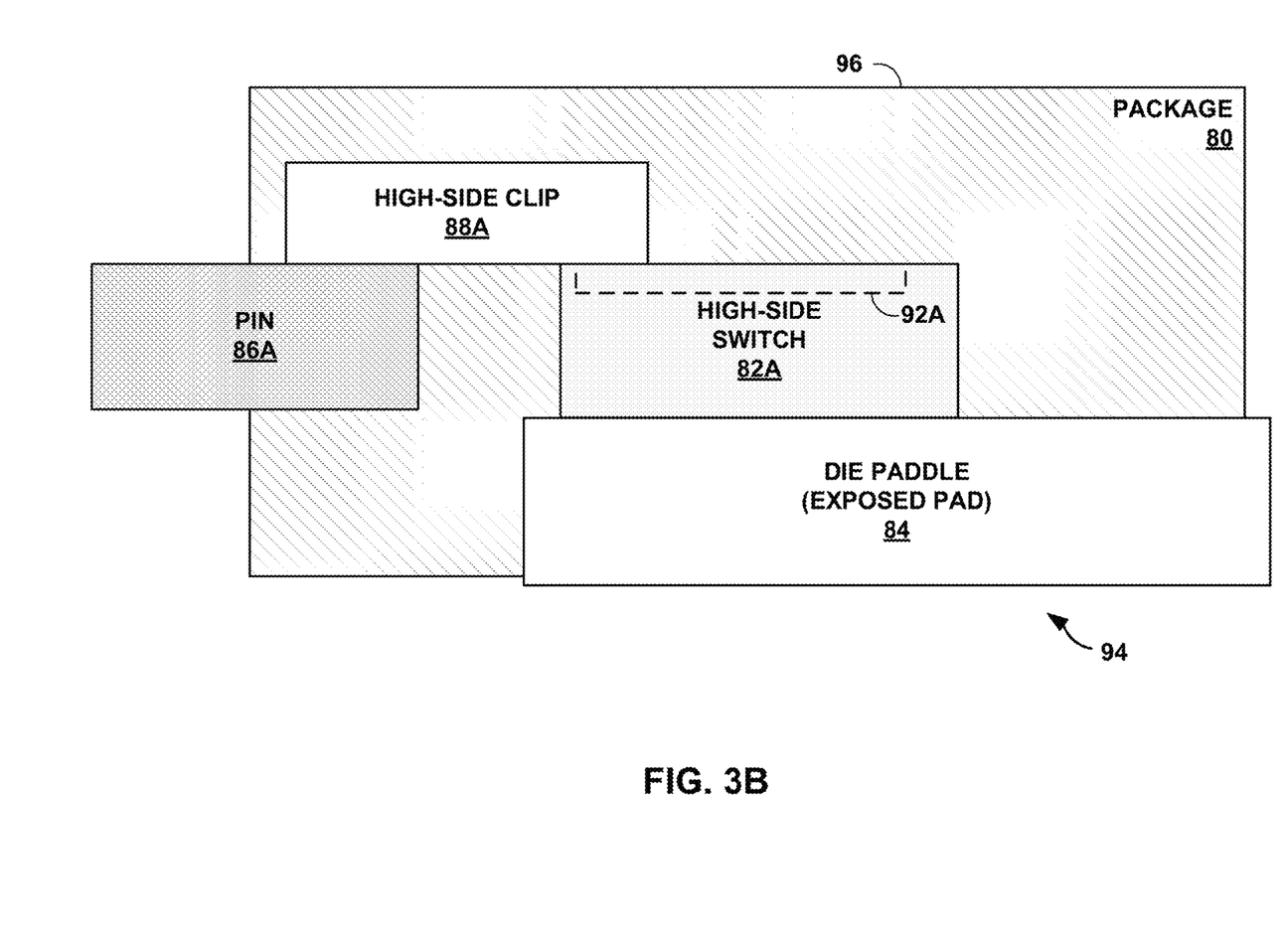
FIG. 3B is a side-view diagram of a half-bridge package, in accordance with some examples of this disclosure.

FIG. 3B is a side-view diagram of a half-bridge package 80, in accordance with some examples of this disclosure. FIG. 3B may depict package 80 along the line A-A' in FIG. 3A. Pin 86A, as well as pins 86B-86E, may extend out of package 80 to electrically connect to external components. In some examples, pin 86A may electrically connect to an input voltage supply, pin 86B may electrically connect to a fail-safe circuit, pins 86C, 86D may electrically connect to a gate driver circuit, and pin 86E may electrically connect to a reference voltage supply. Die paddle 84 may include an exposed pad 94 for electrically connecting to an external component such as an electric motor. The half-bridge circuit of package 80 may produce an output electrical signal at die paddle 84 that may drive an external component such as electric motor.

Package 80 may include molding compound 96 that encapsulates switches 82A, 82B, clips 88A, 88B, and conductive elements 90A-90C. By encapsulating these components of package 80, molding compound 96 may prevent external components from electrically connecting to these components. Molding compound 96 may partially encapsulate pins 86A-86E and die paddle 84 to allow electrical connections with external components. Partial encapsulation may also allow thermal dissipation to cool internal components such as switches 82A, 82B by releasing die paddle 84 and pins 86A-86E.

Package 80 may include advantages over three or more separately packaged switches arranged as another half-bridge circuit. For example, when three or more switches are packaged separately in another half-bridge circuit, the other half-bridge circuit may include three discretely packaged switches electrically connected in series. To add a second control terminal to the high side or the low side of the other half-bridge circuit, the other half-bridge circuit may include two discrete high-side switches or two discrete low-side switches connected in series, where a control terminal of one of the high-side switches is connected to a fail-safe circuit and a control terminal of the other high-side switch is connected to a gate driver. The electrical connections between the load terminals of the switches in the other half-bridge circuit may be longer than the electrical connections in package 80, which may increase the effect of parasitics in the other half-bridge circuit. In contrast, package 80 may include shorter and fewer electrical connections between switches, terminals, and nodes, thereby reducing the effect of parasitics in package 80. For example, package 80 may experience reduced stray inductances within package 80, as compared to the other half-bridge circuit. Moreover, the other half-bridge circuit may take up more space on a printed circuit board (PCB), as compared to package 80. Conversely, package 80 may conserve board space and be less expensive than another half-bridge circuit including discrete switches.

Figure 4A:
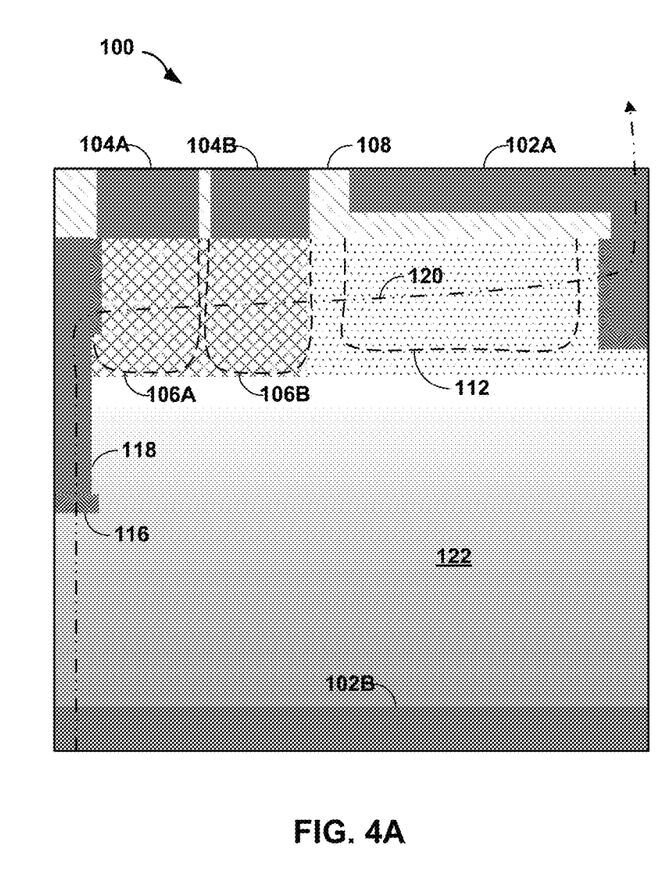
FIG. 4A is a side-view illustration of a dual-gate semiconductor switch, in accordance with some examples of this disclosure.

FIG. 4A is a side-view illustration of a dual-gate semiconductor switch 100, in accordance with some examples of this disclosure. Semiconductor switch 100 may include a vertical transistor with electrons flowing from a load terminal such as source metal 102B on the bottom of semiconductor switch 100 to a load terminal such as drain metal 102A at the top of semiconductor switch 100. In some examples, semiconductor switch 100 may include a lateral transistor with electrons flowing from source groove contact 118 at the left side of semiconductor switch 100 to drain metal 102A at the right side of semiconductor switch 100. In some examples, drain metal 102B may act as a load terminal such as a drain terminal of semiconductor switch 100, and source metal 102A may act as a load terminal such as a source terminal of semiconductor switch 100.

Current path 120 may represent electrons traveling from source metal 102B to drain metal 102A. In some examples, conventional current (i.e., the flow of holes or positive charge carriers) may flow in the opposite direction. Current path 120 may travel from source metal 102B through substrate 122, source connection implant 116, and source groove contact 118 to channels 106A, 106B. Gate 104A may activate channel 106A and gate 104B may activate channel 106B when an appropriate voltage is applied to the respective gate of gates 104A, 104B. When the voltage at either of gates 104A, 104B is not an appropriate voltage, electrical current may not flow through semiconductor switch 100. Current path 120 may travel from channels 106A, 106B through channel 112 to drain metal 102A.

Each of gates 104A, 104B may include a fin that extends into oxide 108 or gates 104A, 104B may wrap around channels 106A, 106B. Gates 104A, 104B and drain metal 102A may be electrically isolated from channels 106A, 106B, 112 by oxide 108. Channel 106A may be adjacent to channel 106B in order to reduce the size of switch 100, as compared to two switches electrically connected in series.

Drain metal 102A and source metal 102B may include metal such as copper, aluminum, or gold or heavily doped semiconductor. Gates 104A, 104B and source groove contact 118 may include heavily doped semiconductor such as polysilicon, a metal compound, and/or any other suitable conductive material. Oxide 108 may include a dielectric material that does not allow the flow of electrical current but allows an electric field to pass through. Channels 106A, 106B, 112, source connection implant 116, and substrate 122 may include doped semiconductor material to allow the flow of electrons in certain circumstances.

Figure 4B:
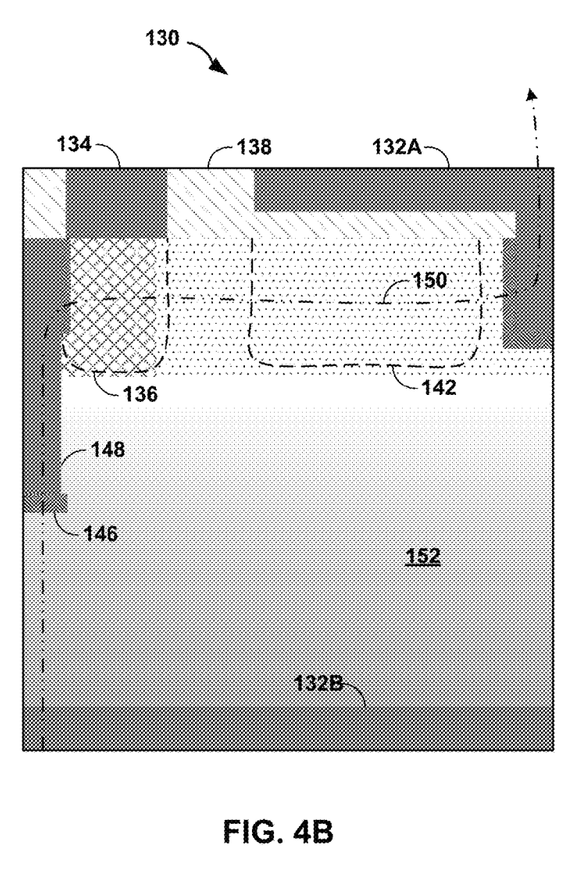
FIG. 4B is a side-view illustration of a single-gate semiconductor switch, in accordance with some examples of this disclosure.

FIG. 4B is a side-view illustration of a single-gate semiconductor switch 130, in accordance with some examples of this disclosure. Semiconductor switch 130 may include current path 150 that flows from source metal 132B to drain metal 132A. Semiconductor switch 130 may include only one channel 136 in current path 150, where channel 136 is activated by an appropriate voltage at gate 134. Current path 150 may pass through substrate 152, source connection implant 146, drain groove contact 148, and channels 136, 142. Gate 134 and drain metal 132A may be separated from channels 136, 142 by oxide 138.

Figure 5:
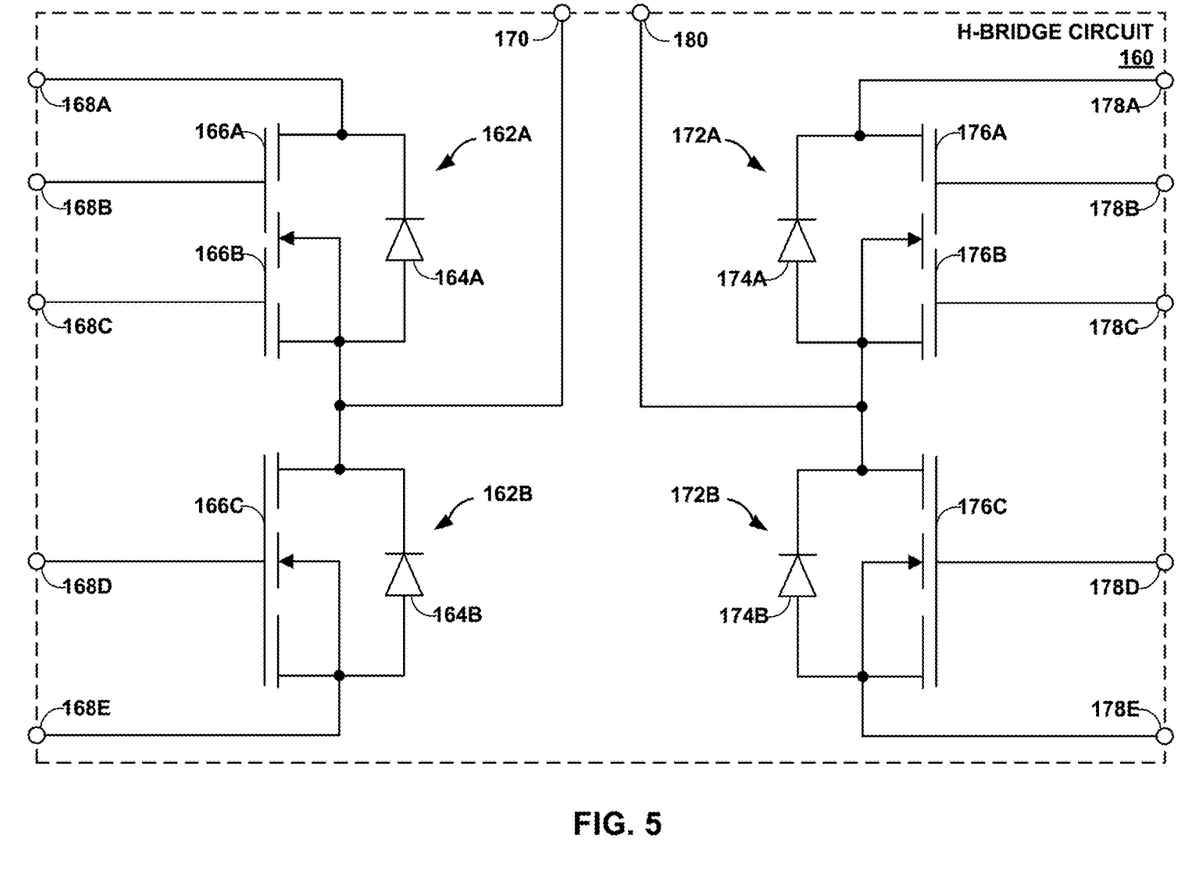
FIG. 5 is a circuit diagram of an H-bridge circuit, in accordance with some examples of this disclosure.

FIG. 5 is a circuit diagram of an H-bridge circuit 160, in accordance with some examples of this disclosure. H-bridge circuit 160 may include two half-bridge circuits, which may include switches 162A, 162B, 172A, 172B. The components within H-bridge circuit 160 may operate in a similar manner to the components within half-bridge circuit 30. A single package including H-bridge circuit 160 may include ten pins corresponding to nodes 168A-168E, 178A-178E. Each of output nodes 170, 180 may include an exposed pad.

Figure 6:
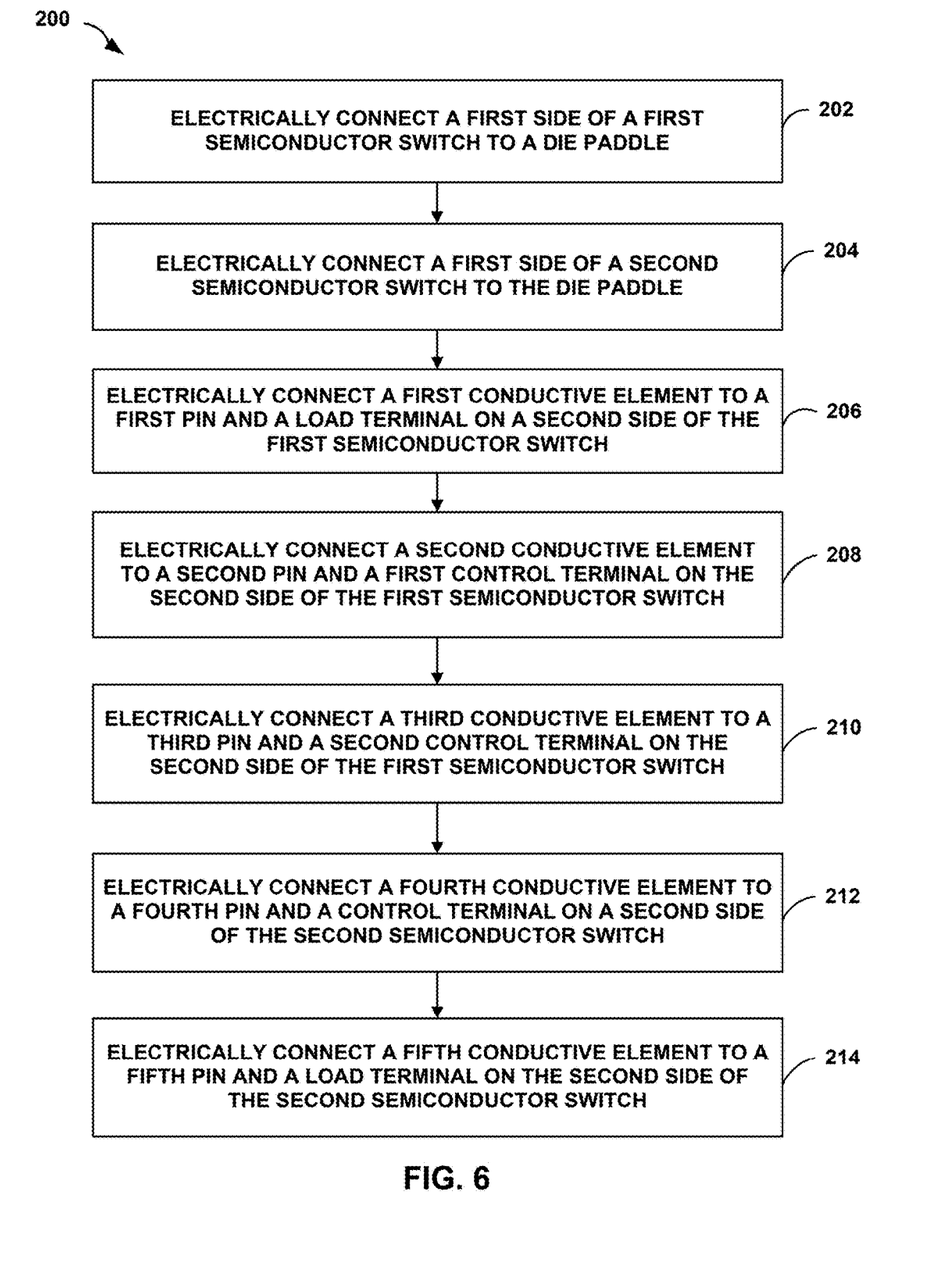
FIG. 6 is a flowchart illustrating a technique for constructing a half-bridge circuit, in accordance with some examples of this disclosure.

FIG. 6 is a flowchart illustrating a technique 200 for constructing a half-bridge circuit, in accordance with some examples of this disclosure. Technique 200 is described with reference to package 80 in FIGS. 3A-3B, although other components, such as half-bridge circuits 4A, 4B, 30, 50 in FIGS. 1-2B, and H-bridge circuits 2, 160 in FIGS. 1 and 5, may exemplify similar techniques.

The technique of FIG. 6 includes electrically connecting a first side of a first semiconductor switch 82A to a die paddle 84 (202). The technique of FIG. 6 also includes electrically connecting a first side of a second semiconductor switch 82B to the die paddle 84 (204). Semiconductor switches 82A, 82B may include discrete transistors or an integrated circuit with both of switches 82A, 82B in a single piece of semiconductor. Switches 82A, 82B may be electrically connected to die paddle 84 by soldering, conductive tape, conductive paste, and/or any other suitable method.

The technique of FIG. 6 also includes electrically connecting a first conductive element 88A to a first pin 86A and a load terminal 92A on a second side of the first semiconductor switch 82A (206). Conductive element 88A may include a copper clip and/or any other suitable conductive element. Conductive element 88A may be electrically connected to semiconductor switch 82A and pin 86A by soldering, conductive tape, conductive paste, and/or any other suitable method. In some examples, pin 86A may electrically connect to an external power supply voltage.

The technique of FIG. 6 also includes electrically connecting a second conductive element 90A to a second pin 86B and a first control terminal 92B on the second side of the first semiconductor switch 82A (208). Conductive element 90A may include a copper wire, gold wire, and/or any other suitable conductive element. Conductive element 90A may be electrically connected to semiconductor switch 82A and pin 86B by soldering, conductive tape, conductive paste, and/or any other suitable method. In some examples, pin 86B may electrically connect to an external fail-safe circuit.

The technique of FIG. 6 also includes electrically connecting a third conductive element 90B to a third pin 86C and a second control terminal 92C on the second side of the first semiconductor switch 82A (210). Conductive element 90B may include a c copper wire, gold wire, and/or any other suitable conductive element. Conductive element 90B may be electrically connected to semiconductor switch 82A and pin 86C by soldering, conductive tape, conductive paste, and/or any other suitable method. In some examples, pin 86C may electrically connect to an external gate driver circuit.

The technique of FIG. 6 also includes electrically connecting a fourth conductive element 90C to a fourth pin 86D and a control terminal 92D on a second side of the second semiconductor switch 82B (212). Conductive element 90C may include a copper wire, gold wire, and/or any other suitable conductive element. Conductive element 90C may be electrically connected to semiconductor switch 82B and pin 86D by soldering, conductive tape, conductive paste, and/or any other suitable method. In some examples, pin 86D may electrically connect to an external gate driver circuit.

The technique of FIG. 6 also includes electrically connecting a fifth conductive element 88B to a fifth pin 86E and a load terminal 92E on the second side of the second semiconductor switch 82B (214). Conductive element 88B may include a copper clip and/or any other suitable conductive element. Conductive element 88B may be electrically connected to semiconductor switch 82B and pin 86E by soldering, conductive tape, conductive paste, and/or any other suitable method. In some examples, pin 86E may electrically connect to an external reference voltage supply.

In some examples, switches 82A, 82B may be encapsulated in molding compound to prevent unintended electrical connections with components outside of package 80. Die paddle 84 and pins 86A-86E may be partially encapsulated to allow for thermal dissipation and electrical connections with components outside of package 80.

In some examples, package 80 may include a second die paddle electrically connected to two semiconductor switches. Thus, package 80 may include an H-bridge circuit with four semiconductor switches. In some examples, package 80 may include more than one H-bridge circuits, where each H-bridge circuit is configured to drive a phase of a multiphase electrical load, such as a multiphase electric motor.

The following numbered examples demonstrate one or more aspects of the disclosure.

Example 1

A half-bridge circuit includes a first switch including a first load terminal, a second load terminal, a first control terminal, and a second control terminal that is electrically isolated from the first control terminal of the first switch. The half-bridge circuit further includes a second switch including a first load terminal electrically connected to the second load terminal of the first switch, a second load terminal, and a control terminal.

Example 2

The half-bridge circuit of example 1, wherein each switch of the first switch and the second switch comprises a vertical field-effect transistor (FET), the first control terminal of the first switch is configured to electrically connect to a gate driver circuit, the second control terminal of the first switch comprises a second gate terminal configured to electrically connect to a fail-safe circuit, and the control terminal of the second switch comprises a gate terminal configured to electrically connect to the gate driver circuit.

Example 3

The half-bridge circuit of examples 1-2 or any combination thereof, wherein the first switch comprises a high-side FET, the second switch comprises a low-side FET, the first load terminal of the first switch comprises a drain terminal configured to electrically connect to an input voltage supply, the second load terminal of the first switch comprises a source terminal configured to electrically connect to an output node, the first load terminal of the second switch comprises a drain terminal, and the second load terminal of the second switch comprises a source terminal configured to electrically connect to a reference voltage supply.

Example 4

The half-bridge circuit of examples 1-3 or any combination thereof, wherein the first switch comprises a low-side FET, the second switch comprises a high-side FET, the first load terminal of the first switch comprises a source terminal configured to electrically connect to a reference voltage supply, the second load terminal of the first switch comprises a drain terminal, the first load terminal of the second switch comprises a source terminal, and the second load terminal of the second switch comprises a drain terminal configured to electrically connect to an input voltage supply.

Example 5

The half-bridge circuit of examples 1-4 or any combination thereof, wherein the second load terminal of the first switch is electrically connected to an output node, and the first load terminal of the second switch is electrically connected to the output node.

Example 6

The half-bridge circuit of examples 1-5 or any combination thereof, wherein the control terminal of the second switch includes a first control terminal configured to electrically connect to the gate driver circuit and a second control terminal configured to electrically connect to the fail-safe circuit, wherein the second control terminal of the second switch is electrically isolated from the first control terminal of the second switch.

Example 7

The half-bridge circuit of examples 1-6 or any combination thereof, wherein the half-bridge circuit is configured to drive an electric motor through the output node to control an electric parking brake, a seat control, a steering wheel lock, or a belt tensioner in an automobile.

Example 8

The half-bridge circuit of examples 1-7 or any combination thereof, wherein the first control terminal of the first switch is electrically connected to a fail-safe circuit including a fail-safe switch.

Example 9

The half-bridge circuit of examples 1-8 or any combination thereof, wherein the first switch comprises a multi-gate fin field effect transistor.

Example 10

The half-bridge circuit of examples 1-9 or any combination thereof, further comprising an AND logic gate, wherein the first control terminal of the first switch and the second control terminal of the first switch comprise a combined control terminal of the first switch, an output of the AND logic gate is electrically connected to the combined control terminal of the first switch, a first input of the AND logic gate is electrically connected to a fail-safe circuit, and a second input of the AND logic gate is electrically connected to a gate driver circuit.

Example 11

A half-bridge circuit package includes a die paddle and a first semiconductor switch electrically connected to the die paddle. The half-bridge circuit package further includes a second semiconductor switch electrically connected to the die paddle and at least five pins including a first pin electrically connected to a load terminal of the first semiconductor switch. The at least five pins further include a second pin electrically connected to a first control terminal of the first semiconductor switch. The at least five pins further include a third pin electrically connected to a second control terminal of the first semiconductor switch, wherein the second control terminal of the first semiconductor switch is electrically isolated from the first control terminal of the first semiconductor switch. The at least five pins further include a fourth pin electrically connected to a control terminal of the second semiconductor switch. The at least five pins further include a fifth pin electrically connected to a load terminal of the second semiconductor switch.

Example 12

The half-bridge circuit package of example 11, wherein the first semiconductor switch comprises a high-side vertical field-effect transistor (FET), the second semiconductor switch comprises a low-side vertical FET, the load terminal of the first semiconductor switch comprises a drain terminal, the first semiconductor switch is electrically connected to the die paddle by at least a source terminal of the first semiconductor switch, the load terminal of the second semiconductor switch comprises a source terminal, and the second semiconductor switch is electrically connected to the die paddle by at least a drain terminal of the second semiconductor switch.

Example 13

The half-bridge circuit package of examples 11-12 or any combination thereof, wherein the first semiconductor switch comprises a low-side vertical field-effect transistor (FET), the second semiconductor switch comprises a high-side vertical FET, the load terminal of the first semiconductor switch comprises a source terminal, the first semiconductor switch is electrically connected to the die paddle by at least a drain terminal of the first semiconductor switch, the load terminal of the second semiconductor switch comprises a drain terminal, and the second semiconductor switch is electrically connected to the die paddle by at least a source terminal of the second semiconductor switch.

Example 14

The half-bridge circuit package of examples 11-13 or any combination thereof, wherein the package includes an exposed pad electrically connected to the die paddle, and the exposed pad is configured to electrically connect to an electrical load.

Example 15

The half-bridge circuit package of examples 11-14 or any combination thereof, wherein the first pin is electrically connected to the load terminal of the first semiconductor switch by at least a first clip, the second pin is electrically connected to the first control terminal of the first semiconductor switch by at least a first wire, the third pin is electrically connected to the second control terminal of the first semiconductor switch by at least a second wire, the fourth pin is electrically connected to the control terminal of the second semiconductor switch by at least a third wire, and the fifth pin is electrically connected to the load terminal of the second semiconductor switch by at least a second clip.

Example 16

The half-bridge circuit package of examples 11-15 or any combination thereof, wherein each switch of the first semiconductor switch and the second semiconductor switch comprises a vertical field-effect transistor (FET), a source terminal of the first semiconductor switch is positioned on a first side of the first semiconductor switch and electrically connected to the die paddle, and a drain terminal of the second semiconductor switch is positioned on a first side of the second semiconductor switch and electrically connected to the die paddle. The load terminal of the first semiconductor switch comprises a drain terminal that is positioned on a second side of the first semiconductor switch and electrically connected to the first pin. The load terminal of the second semiconductor switch comprises a source terminal that is positioned on a second side of the second semiconductor switch and electrically connected to the fifth pin. The first side of the first semiconductor switch is opposite from the second side of the first semiconductor switch, and the first side of the second semiconductor switch is opposite from the second side of the second semiconductor switch.

Example 17

The half-bridge circuit package of examples 11-16 or any combination thereof, wherein the first semiconductor switch comprises a first control channel configured to conduct electricity based on a voltage at the first control terminal of the first semiconductor switch, and a second control channel configured to conduct electricity based on a voltage at the second control terminal of the first semiconductor switch, wherein the first control channel and the second control channel are adjacent.

Example 18

The half-bridge circuit package of examples 11-17 or any combination thereof, wherein the first control terminal of the first switch and the second control terminal of the first switch comprise a combined control terminal of the first switch, the first semiconductor switch comprises an AND logic gate, an output of the AND logic gate is electrically connected to the combined control terminal, a first input of the AND logic gate is electrically connected to a fail-safe circuit, and a second input of the AND logic gate is electrically connected to a gate driver circuit.

Example 19

The half-bridge circuit package of examples 11-18 or any combination thereof, further comprising an H-bridge package including a second die paddle, a third semiconductor switch electrically connected to the second die paddle, and a fourth semiconductor switch electrically connected to the second die paddle. The at least five pins include a sixth pin electrically connected to a load terminal of the third semiconductor switch, a seventh pin electrically connected to a first control terminal of the third semiconductor switch, an eighth pin electrically connected to a second control terminal of the third semiconductor switch, wherein the second control terminal of the third semiconductor switch is electrically isolated from the first control terminal of the third semiconductor switch, a ninth pin electrically connected to a control terminal of the fourth semiconductor switch, and a tenth pin electrically connected to a load terminal of the fourth semiconductor switch.

Example 20

A method for constructing a half-bridge circuit package, the method including electrically connecting a first side of a first semiconductor switch to a die paddle and electrically connecting a first side of a second semiconductor switch to the die paddle. The method further includes electrically connecting a first conductive element to a first pin and a load terminal on a second side of the first semiconductor switch. The method further includes electrically connecting a second conductive element to a second pin and a first control terminal on the second side of the first semiconductor switch. The method further includes electrically connecting a third conductive element to a third pin and a second control terminal on the second side of the first semiconductor switch. The method further includes electrically connecting a fourth conductive element to a fourth pin and a control terminal on a second side of the second semiconductor switch. The method further includes electrically connecting a fifth conductive element to a fifth pin and a load terminal on the second side of the second semiconductor switch.

Example 21

The method of example 20, further including encapsulating the first semiconductor switch, the second semiconductor switch, the first conductive element, the second conductive element, the third conductive element, the fourth conductive element, and the fifth conductive element with a molding compound. The method further includes partially encapsulating the die paddle, the first pin, the second pin, the third pin, the fourth pin, and the fifth pin with the molding compound Various examples of the disclosure have been described. Any combination of the described systems, operations, or functions is contemplated. These and other examples are within the scope of the following claims.

What is claimed is:
1. A half-bridge circuit comprising:
a first switch including:
 a first load terminal,
 a second load terminal,
 a first control terminal, and
 a second control terminal that is electrically isolated from the first control terminal of the first switch; and
a second switch including:
 a first load terminal electrically connected to the second load terminal of the first switch,
 a second load terminal, and
 a control terminal.
2. The half-bridge circuit of claim 1, wherein:
each switch of the first switch and the second switch comprises a vertical field-effect transistor (FET);
the first control terminal of the first switch is configured to electrically connect to a gate driver circuit;
the second control terminal of the first switch comprises a second gate terminal configured to electrically connect to a fail-safe circuit; and
the control terminal of the second switch comprises a gate terminal configured to electrically connect to the gate driver circuit.
3. The half-bridge circuit of claim 2, wherein:
the first switch comprises a high-side FET;
the second switch comprises a low-side FET;
the first load terminal of the first switch comprises a drain terminal configured to electrically connect to an input voltage supply;
the second load terminal of the first switch comprises a source terminal configured to electrically connect to an output node;

the first load terminal of the second switch comprises a drain terminal; and
the second load terminal of the second switch comprises a source terminal configured to electrically connect to a reference voltage supply.

4. The half-bridge circuit of claim 2, wherein:
the first switch comprises a low-side FET;
the second switch comprises a high-side FET;
the first load terminal of the first switch comprises a source terminal configured to electrically connect to a reference voltage supply;
the second load terminal of the first switch comprises a drain terminal;
the first load terminal of the second switch comprises a source terminal; and
the second load terminal of the second switch comprises a drain terminal configured to electrically connect to an input voltage supply.

5. The half-bridge circuit of claim 4, wherein the control terminal of the second switch includes:
a first control terminal configured to electrically connect to the gate driver circuit, and
a second control terminal configured to electrically connect to the fail-safe circuit, wherein the second control terminal of the second switch is electrically isolated from the first control terminal of the second switch.

6. The half-bridge circuit of claim 5, wherein the half-bridge circuit is configured to drive an electric motor through the output node to control an electric parking brake, a seat control, a steering wheel lock, or a belt tensioner in an automobile.

7. The half-bridge circuit of claim 1, wherein the first control terminal of the first switch is electrically connected to a fail-safe circuit including a fail-safe switch.

8. The half-bridge circuit of claim 1, wherein the first switch comprises a multi-gate fin field effect transistor.

9. The half-bridge circuit of claim 1, further comprising an AND logic gate, wherein:
the first control terminal of the first switch and the second control terminal of the first switch comprise a combined control terminal of the first switch;
an output of the AND logic gate is electrically connected to the combined control terminal of the first switch;
a first input of the AND logic gate is electrically connected to a fail-safe circuit; and
a second input of the AND logic gate is electrically connected to a gate driver circuit.

10. A half-bridge circuit package comprising:
a die paddle;
a first semiconductor switch electrically connected to the die paddle;
a second semiconductor switch electrically connected to the die paddle;
at least five pins including:
a first pin electrically connected to a load terminal of the first semiconductor switch,
a second pin electrically connected to a first control terminal of the first semiconductor switch,
a third pin electrically connected to a second control terminal of the first semiconductor switch, wherein the second control terminal of the first semiconductor switch is electrically isolated from the first control terminal of the first semiconductor switch,
a fourth pin electrically connected to a control terminal of the second semiconductor switch, and
a fifth pin electrically connected to a load terminal of the second semiconductor switch.

11. The half-bridge circuit package of claim 10, wherein:
the first semiconductor switch comprises a high-side vertical field-effect transistor (FET);
the second semiconductor switch comprises a low-side vertical FET;
the load terminal of the first semiconductor switch comprises a drain terminal;
the first semiconductor switch is electrically connected to the die paddle by at least a source terminal of the first semiconductor switch;
the load terminal of the second semiconductor switch comprises a source terminal; and
the second semiconductor switch is electrically connected to the die paddle by at least a drain terminal of the second semiconductor switch.

12. The half-bridge circuit package of claim 10, wherein:
the first semiconductor switch comprises a low-side vertical field-effect transistor (FET);
the second semiconductor switch comprises a high-side vertical FET;
the load terminal of the first semiconductor switch comprises a source terminal;
the first semiconductor switch is electrically connected to the die paddle by at least a drain terminal of the first semiconductor switch;
the load terminal of the second semiconductor switch comprises a drain terminal; and
the second semiconductor switch is electrically connected to the die paddle by at least a source terminal of the second semiconductor switch.

13. The half-bridge circuit package of claim 10, wherein:
the package includes an exposed pad electrically connected to the die paddle; and
the exposed pad is configured to electrically connect to an electrical load.

14. The half-bridge circuit package of claim 10, wherein:
the first pin is electrically connected to the load terminal of the first semiconductor switch by at least a first clip;
the second pin is electrically connected to the first control terminal of the first semiconductor switch by at least a first wire;
the third pin is electrically connected to the second control terminal of the first semiconductor switch by at least a second wire;
the fourth pin is electrically connected to the control terminal of the second semiconductor switch by at least a third wire; and
the fifth pin is electrically connected to the load terminal of the second semiconductor switch by at least a second clip.

15. The half-bridge circuit package of claim 14, wherein:
each switch of the first semiconductor switch and the second semiconductor switch comprises a vertical field-effect transistor (FET);
a source terminal of the first semiconductor switch is positioned on a first side of the first semiconductor switch and electrically connected to the die paddle;
a drain terminal of the second semiconductor switch is positioned on a first side of the second semiconductor switch and electrically connected to the die paddle;
the load terminal of the first semiconductor switch comprises a drain terminal that is positioned on a second side of the first semiconductor switch and electrically connected to the first pin;
the load terminal of the second semiconductor switch comprises a source terminal that is positioned on a second side of the second semiconductor switch and electrically connected to the fifth pin;

the first side of the first semiconductor switch is opposite from the second side of the first semiconductor switch; and the first side of the second semiconductor switch is opposite from the second side of the second semiconductor switch.

16. The half-bridge circuit package of claim 10, wherein the first semiconductor switch comprises:
a first control channel configured to conduct electricity based on a voltage at the first control terminal of the first semiconductor switch; and
a second control channel configured to conduct electricity based on a voltage at the second control terminal of the first semiconductor switch, wherein the first control channel and the second control channel are adjacent.

17. The half-bridge circuit package of claim 10, wherein:
the first control terminal of the first switch and the second control terminal of the first switch comprise a combined control terminal of the first switch;
the first semiconductor switch comprises an AND logic gate;
an output of the AND logic gate is electrically connected to the combined control terminal;
a first input of the AND logic gate is electrically connected to a fail-safe circuit; and
a second input of the AND logic gate is electrically connected to a gate driver circuit.

18. The half-bridge circuit package of claim 10, further comprising the half-bridge circuit package comprises an H-bridge package including a second die paddle, a third semiconductor switch electrically connected to the second die paddle, and a fourth semiconductor switch electrically connected to the second die paddle, wherein the at least five pins include:
a sixth pin electrically connected to a load terminal of the third semiconductor switch,
a seventh pin electrically connected to a first control terminal of the third semiconductor switch,
an eighth pin electrically connected to a second control terminal of the third semiconductor switch, wherein the second control terminal of the third semiconductor switch is electrically isolated from the first control terminal of the third semiconductor switch,
a ninth pin electrically connected to a control terminal of the fourth semiconductor switch, and
a tenth pin electrically connected to a load terminal of the fourth semiconductor switch.

19. The half-bridge circuit package of claim 10, wherein:
the second pin is electrically connected to the first control terminal of the first semiconductor switch by at least a wire or a ribbon;
the third pin is electrically connected to the second control terminal of the first semiconductor switch by at least a wire or a ribbon; and
the fourth pin is electrically connected to the control terminal of the second semiconductor switch by at least a wire or a ribbon.

20. The half-bridge circuit package of claim 10, wherein:
the first pin is electrically connected to the load terminal of the first semiconductor switch by at least a metal layer, a clip, or a ribbon; and
the fifth pin is electrically connected to the load terminal of the second semiconductor switch by at least a metal layer, a clip, or a ribbon.

\* \* \* \* \*